US 9,250,276 B2

(12) United States Patent
Gilbert

(10) Patent No.: US 9,250,276 B2
(45) Date of Patent: Feb. 2, 2016

(54) MICROWAVE VOLTMETER USING FULLY-LINEARIZED DIODE DETECTOR

(71) Applicant: Analog Devices, Inc., Norwood, MA (US)

(72) Inventor: Barrie Gilbert, Beaverton, OR (US)

(73) Assignee: Analog Devices, Inc., Norwood, MA (US)

( * ) Notice: Subject to any disclaimer, the term of this patent is extended or adjusted under 35 U.S.C. 154(b) by 93 days.

(21) Appl. No.: 14/041,571

(22) Filed: Sep. 30, 2013

(65) Prior Publication Data

US 2015/0091549 A1   Apr. 2, 2015

(51) Int. Cl.
*G01R 31/00*   (2006.01)
*G01R 21/10*   (2006.01)
*G01R 21/06*   (2006.01)

(52) U.S. Cl.
CPC .............. *G01R 21/10* (2013.01); *G01R 21/06* (2013.01)

(58) Field of Classification Search
CPC .... G01R 15/246; G01R 15/242; G01R 1/071; G01R 15/241; G01R 15/247; G01R 25/00; G01R 31/11; G01R 31/08; G01R 31/24; G01R 27/00; G01K 11/006; H04B 17/0057; G01S 3/48; G01V 3/02; G01V 3/12; G01V 3/15; G01V 3/38; G01V 3/08; G01P 3/486; G01P 3/4802; G01P 3/489
USPC .......... 324/96, 76.14, 85, 336, 175, 520, 443, 324/609, 610
See application file for complete search history.

(56) References Cited

U.S. PATENT DOCUMENTS

| 3,807,816 | A | * | 4/1974 | Hamburg | 327/348 |
| 4,791,380 | A | * | 12/1988 | Chiappetta | H03D 1/10 327/513 |
| 4,853,643 | A | * | 8/1989 | Herleikson | H03D 1/10 329/353 |
| 4,888,558 | A | * | 12/1989 | Hereikson | 329/345 |
| 5,117,377 | A | * | 5/1992 | Finman | G01S 7/4004 333/103 |
| 5,157,786 | A | * | 10/1992 | Muterspaugh | 455/326 |
| 6,429,638 | B1 | | 8/2002 | Wight et al. | |
| 6,678,506 | B1 | | 1/2004 | Dolman et al. | |
| 7,305,327 | B2 | * | 12/2007 | Sper | 702/187 |
| 7,369,816 | B2 | * | 5/2008 | Kappes et al. | 455/73 |
| 2003/0035451 | A1 | | 2/2003 | Ishida et al. | |
| 2004/0217807 | A1 | | 11/2004 | Andle | |
| 2004/0242170 | A1 | | 12/2004 | Gilbert | |
| 2006/0012422 | A1 | | 1/2006 | Saito | |
| 2008/0116970 | A1 | * | 5/2008 | Asam | H03G 3/3042 330/129 |
| 2009/0021282 | A1 | | 1/2009 | Matsui | |
| 2009/0261863 | A1 | * | 10/2009 | Kurihara | 327/89 |

OTHER PUBLICATIONS

International Search Report issued in International Patent Application Serial No. PCT/US2014/058046 mailed Jan. 2, 2015, 4 pages.
Written Opinion issued in International Patent Application Serial No. PCT/US2014/058046 mailed Jan. 2, 2015), 9 pages.

* cited by examiner

*Primary Examiner* — Tung X Nguyen
*Assistant Examiner* — Thang Le
(74) *Attorney, Agent, or Firm* — Patent Capital Group

(57) ABSTRACT

A radio frequency diode detector has a set of diodes having a differential voltage output, and a current source electrically coupled to the ring of diodes, the current source coupled to provide a forward bias current. This is followed by nonlinear signal processing to create an overall linear detector suitable for use in microwave power measurement.

21 Claims, 6 Drawing Sheets

MICROWAVE VOLTMETER USING FULLY-LINEARIZED DIODE DETECTOR

BACKGROUND

Many situations require the detection of power in microwave communication links such as point-to-point communication links for high speed data communications. These wide band communication links run at high gigahertz frequencies, typically up to 24 GHz, and incur the need to measure carrier power in both transmitters and receivers over a wide dynamic range. In fact, the determination of power is indirect. Practically all integrated circuit (IC) solutions used in power measurement applications actually measure the voltage arising across a known load impedance, usually, but not necessarily, 50Ω. For example, a signal of amplitude 223.6 mVrms develops a power of $P=V^2/R=0.2236^2/50=0.001$ W. RF systems universally express power levels in milliwatts, and use the decibel equivalent expressed in dBm. The power developed by a 223.6 mVrms signal into a 50Ω load is 1 mW, which in decibel form is 0 dBm.

This power level is roughly at the center of typical ranges which need to be measured, ranging roughly from −30 dBm to +13 dBm. In voltage terms, this requires the determination of voltages spanning the range 7.07 mVrms to 1 Vrms, or about 141:1 in voltage terms and 43 dB in power terms.

In the past, RF power measurement has often employed logarithmic amplifiers (log amps) to address the dynamic range challenge. However, at microwave frequencies, suitable log amps require the use of the fastest available IC processes. They are also relatively complicated circuits, needing voltage references to establish their scaling rules, slope and intercept, and consume a great deal of supply current, typically on the order of 100 mA.

On the other hand, detectors based on Schottky diodes inherently have a rapid response, and have been used for decades in power measurement applications. They are now available in many IC processes. Their appeal lies in the fact that, once the RF amplitude is determined (usually referred to as the 'envelope response') the remaining signal processing can be carried out at relatively low frequencies, and typically at less than 1/100-th the supply current needed for a log amp. Further, the detection response can readily extend to signal frequencies of 100 GHz, roughly four times higher than the fastest available log amps.

Unfortunately, conventional diode detectors have an extremely nonlinear response. This is especially troublesome at small signal amplitudes; their output at low levels follows a roughly square-law characteristic, and, consequently, they are very insensitive to small signals. As usually implemented, they also have inherently poor temperature behavior, which erodes accuracy. These limitations are overcome by the measures described herein.

DETAILED DESCRIPTION

Figure 1:
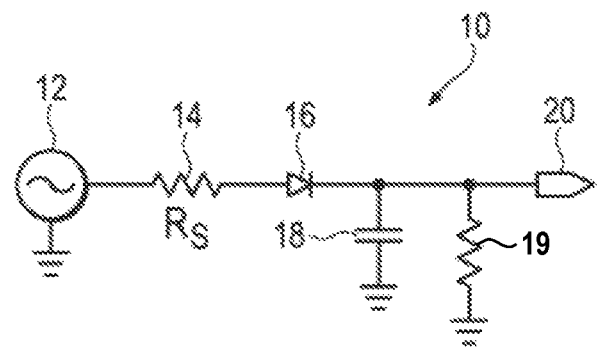
FIG. 1 shows a prior embodiment of a radio frequency (RF) diode detector.

FIG. 1 shows a prior art embodiment of a radio frequency (RF) power detector. Here, the RF generator 12 generates the signal power whose amplitude the detector must measure; the resistor 14 represents the source resistance of this generator. The diode 16 may consist of a Schottky diode having a metal-to-semiconductor interface, rather than a semiconductor-to-semiconductor interface, as in a traditional diode. A load capacitor 18 and load resistor 19 connect the output of the diode 16 to ground. The polarity direction of the diode is not of operational significance, but FIG. 1 shows the RF signal applied to the anode of the diode 16, with the output taken from the cathode.

In a simple analysis, it is stated that when the load capacitor 18 becomes fully charged, no current flows in the diode 16 and the circuit therefore becomes a 'peak detector.' In practice, this state of affairs is substantially altered by the presence of the load resistor 19, which discharges the load capacitor 18 between the peak instants of the signal, to a greater or lesser degree. There is a finite average current in the diode 16, causing the output voltage to be less than the peak voltage of the RF input. Because of the diode's voltage/current behavior, even small amounts of average current introduce a very significant voltage drop. This reduction in response becomes very pronounced at even moderate signal levels, and profoundly so at millivolt-level RF inputs.

Figure 2:
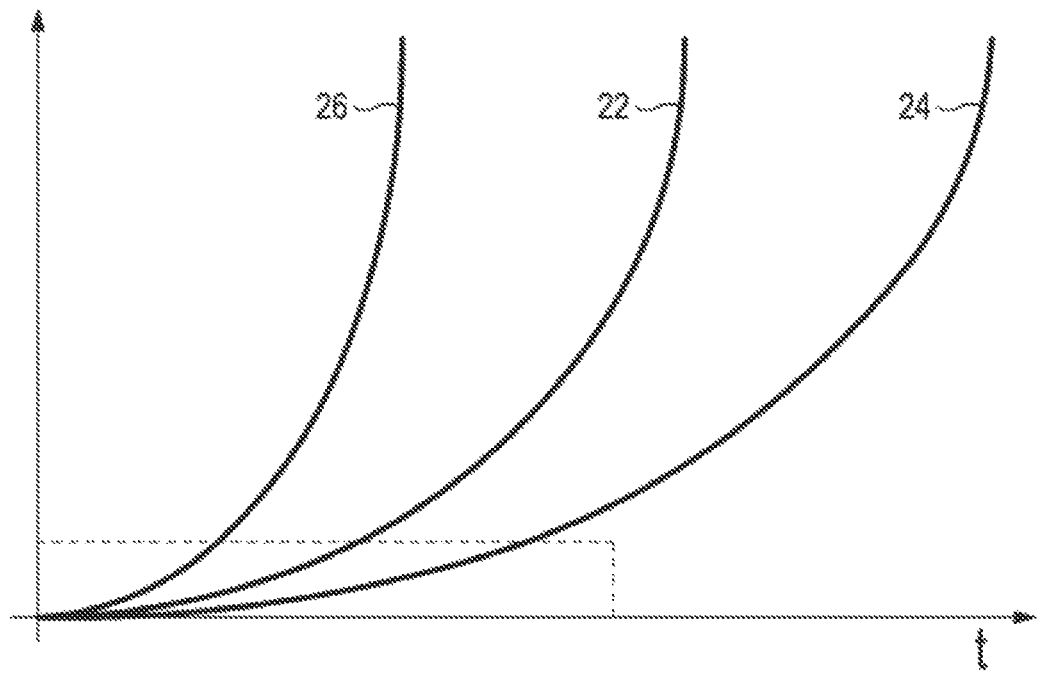
FIG. 2 shows a graph of a prior art detector response.

This simple type of detector suffers from other problems in measurement applications, one of which is its extreme variation in scaling accuracy over its operating temperature range. FIG. 2 shows an example of the amplitude response for this type of detector, demonstrating the loss of sensitivity at lower powers. The response curve 22 demonstrates the response at moderate temperatures. At low temperatures, the response would follow the curve 24, while at higher temperatures, it would appear more like the curve 26.

This variation across the operating temperature range raises a serious problem with this simple detector embodiment. A further problem arises because the input impedance of such a detector is also nonlinear, and is prone to generating even-order harmonic signals which are reflected back into the source. A practical transmitter or receiver channel is very susceptible to such distortion components. It should be noted here that modern systems have to meet extremely stringent specifications in this regard, and therefore it is evident that a detector that does not generate such distortion would be valuable.

Figure 3:
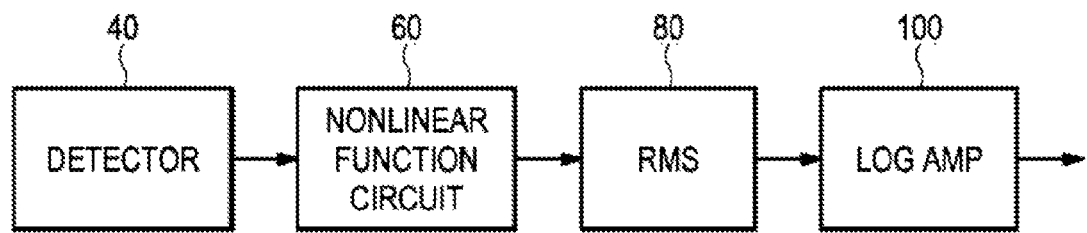
FIG. 3 shows a typical embodiment of an RF detection system.

FIG. 3 shows an embodiment of an RF detection system. The detector 40 provides input to a nonlinear function circuit 60. The elaborated system may optionally include a post-detection RMS (root mean square) module 80 and a log amp module 100. The RMS module 80 converts a fluctuating output of the detector to a steady state signal more closely representing the signal power, and the optional log amp module 100 may then convert this to a decibel representation. These modules may be used or not depending on the overall requirements of the measurement system.

Figure 4:
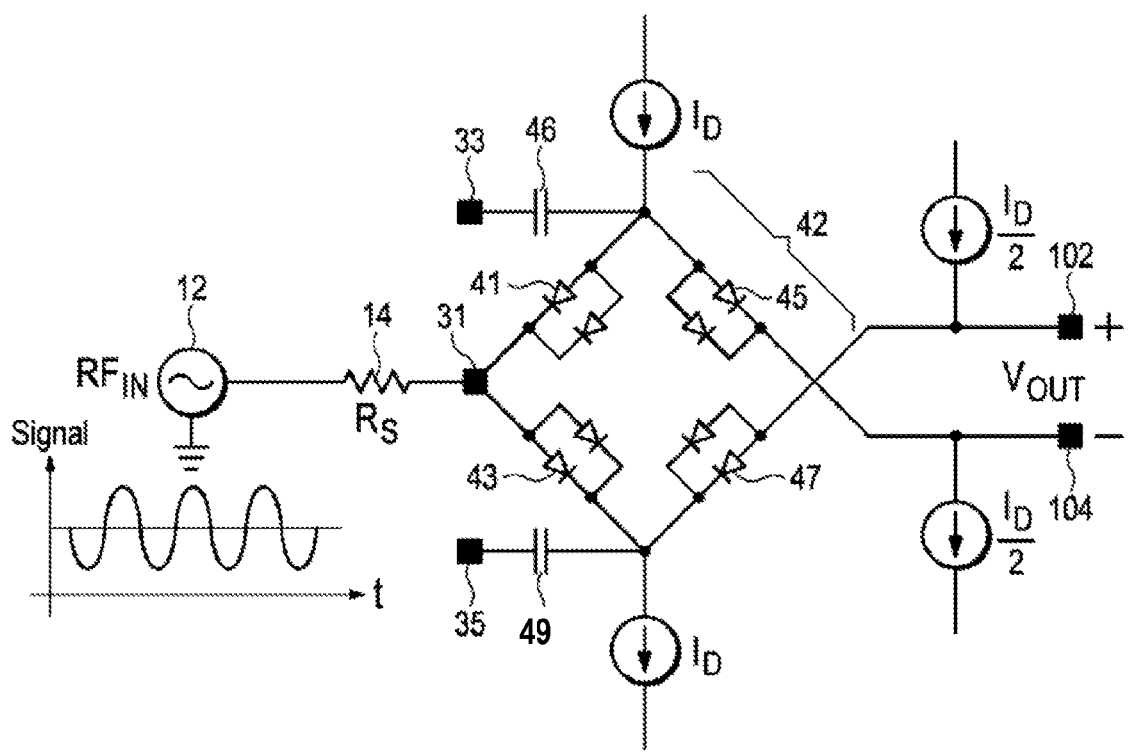
FIG. 4 shows a typical embodiment of an RF diode detector.

FIG. 4 shows an embodiment of an improved diode detector having a high dynamic range and stable operation over temperature. The RF source 12 and its source resistance 14 are connected to a set of diodes 42, which, even in the absence of an applied signal, are held in conduction by the small bias current $I_D$. In this way, the diodes 42 are already operating in forward bias when the applied RF voltage is small, avoiding the insensitivity at the lower levels. The current flows through diode 41 to diode 43, and simultaneously through diodes 45 and 47. Two charge-holding load capacitors 46 and 49 are now used, one following positive signal excursions and the other following negative signal excursions. These connect to circuit nodes 33 and 35, respectively, physically placed close to the input node 31, making a very short RF path.

Due to the use of equal bias currents, there is no net DC voltage developed across the source resistance at the input node 31, which is at ground or zero potential. Also, in the absence of an RF input, the output of diode 41 is likewise returned the ground potential, due to the matching of the equally sized diodes, having the same saturation current (herein denoted by $I_S$) as is familiar in semiconductor device theory. With the application of an RF signal, the voltage on the circuit node 33 increases in a positive direction with increases in the signal amplitude, and the voltage on the output node 102 follows this increase, starting from a zero-input baseline of zero. Similarly, with the application of an RF signal, the voltage on the circuit node 35 increases in a negative direction with increases in the signal amplitude, and the voltage on the output node 104 follows this voltage, again starting from a zero-input baseline of zero.

This circuit develops two voltage outputs, which, for large signal inputs essentially follow the positive and negative peaks of the applied RF signal. This provides a voltage-doubling response, without the voltage drops normally encountered in a simple diode detector.

Further, due to the symmetry of the FIG. 4 circuit, the input impedance is much more linear than in prior art embodiments. In the prior art embodiments, when current flows only during on-signal polarity, even-order distortion components are reflected back into the source. In this embodiment, only weak odd-order reflections occurs. Typically the source would consist of power amplifier whose output drives an antenna, but a small sample of which is delivered to the detector by the directional coupler. With the asymmetric half-wave rectifier of the prior art, even-order distortion components may couple back to the antenna and negatively impact the transmitted signal. Similar problems arise in a receiver channel. Odd-order distortion is generally more tolerable in this context.

In a practical embodiment, the diodes are 'doubled-up,' using eight equally-sized devices, as shown. This is a layout measure taken to mitigate the offset-inducing effects of various chip gradients, such as temperature, strain, etc., and merely one embodiment, which may not be necessary or desirable, depending on the practical circumstances.

The circuit topology of FIG. 4, with the pre-biasing currents $I_D$, may improve the detector response in the several ways just described. But the detector still responds in an essentially square-law manner to small signal amplitudes, becoming progressively more linear at higher input levels. Referring back to FIG. 3, the nonlinear function circuit 60 may allow the response to be linearized.

Figure 5:
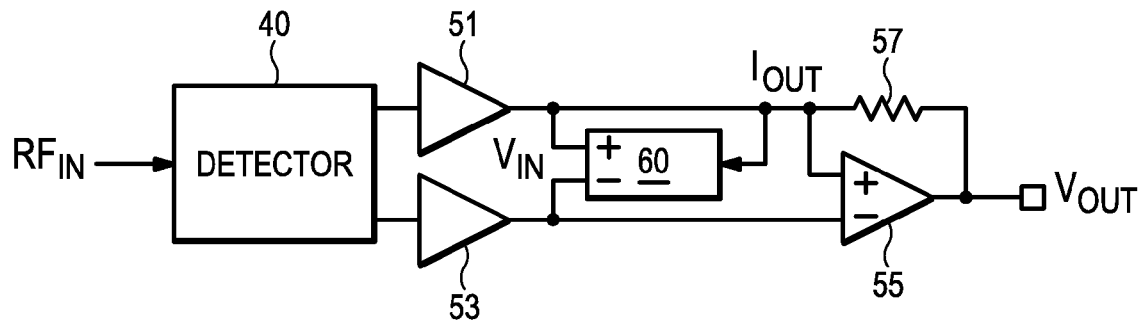
FIG. 5 shows an embodiment of a portion of an RF detector.

FIG. 5 shows a portion of the system of FIG. 3, focusing on the relationship between the detector and the nonlinear function circuit 60. An appropriate example of a nonlinear function circuit 60 would be a 'square rooting' circuit that produces an output that is the square root of the input. In FIG. 5, the outputs of the detector from FIG. 4 are first buffered. The output voltages of the detector are very small at the low end of the input amplitude range. For example, at an input of −35 dBm at 50Ω, the signal amplitude for a sine wave input is only 4 mV, and the corresponding output voltage of the detector cell will be in the microvolt range.

It is important that the bias currents $I_D$ be very well matched. It will further be apparent that the loading of the outputs of this detector may be only very lightly loaded. This is the function of the buffer amplifier stages 51 and 53 in FIG. 5. These need not be unity-gain buffers, although, in view of the typically small supply voltage of a practical IC and the voltage doubling property of the detector, this may be the preferred choice.

The buffered outputs are applied to the nonlinear function circuit 60, which is arranged to have the inverse amplitude response of the detector at low signal levels, which as we have seen is square-law. The appropriate nonlinear function is the square-root function. In theory, this function has infinite incremental gain at zero input. In practice, its implementation requires the provision of very high increment gain for small inputs.

It has been explained that while diode detectors exhibit a very weak response to small input signals, this response becomes asymptotic to a peak-detection, linear function at high input levels. One of the requirements of a fully-linearized RF voltmeter, which is a more accurate description of the function of integrated-circuit "power" detectors, is that the square-root function must be gradually "softened" or weakened at high signal levels. A practical implementation requires very careful characterization of the basic detector cell of FIG. 4 to ensure an accurate overall fit to a fully-linear response. Further, the scaling of the square-rooting cell must be arranged to have the necessary temperature behavior.

The signal out from the detector, shown in FIG. 4 as $V_{OUT}$, becomes $V_{IN}$ to the nonlinear function circuit 60. This signal is also fed forward to the linear amplifier 55. The nonlinear function circuit 60 injects a current $I_{OUT}$ into the path of the linear amplifier 55 at the node where it connects to the input of the linear amplifier. Because there is a finite resistance at that node, the injected current causes the single-line output to be positive, where the output value can be viewed as flowing in the direction shown. Because the output current is the square root of the input voltage, eventually the nonlinear function circuit 60 will 'turn off,' or have no further effect on the output signal. The end result is that the output of the linear amplifier results from the nonlinear function circuit at low signal levels, and results from the detector response at higher signal levels (where the detector response becomes linear).

Figure 6:
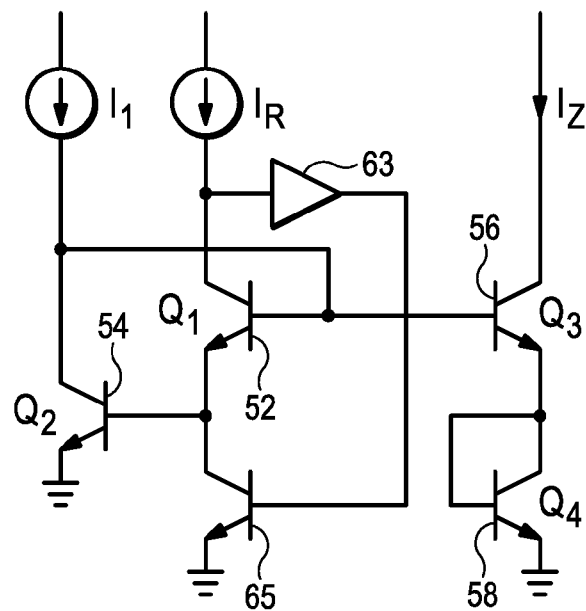
FIG. 6 shows an embodiment of a nonlinear function circuit.

FIG. 6 shows one embodiment of the nonlinear function circuit 60; in this instance, a square root circuit. The current $I_1$ is connected to the transistor 54, Q2. The reference current $I_R$ is connected to the transistor 52, Q1. The unknown current value $I_Z$ is the one of interest and is connected to transistor 56, Q3, and through it to the transistor 58, Q4. The relationships are as follows:

$$V_{BE1} + V_{BER} = V_{BEZ} + V_{BEZ},$$

which leads to:

$$V_K \text{Log}(I_1/I_S) + V_K \text{Log}(I_R/I_S) = V_K \text{Log}(I_Z/I_S) + V_K \text{Log}(I_Z/I_S);$$

where $V_K$ is the thermal voltage of the transistors.

The thermal voltages cancel, as do the source currents $I_S$. Using the rules of logarithms, the sum of Log $I_1$ and Log $I_R$ results in Log $I_1$ $I_R$ being equivalent to Log $I_Z$ $I_Z$. The logs cancel, and the result is that $I_Z$ equals the square root of $I_1$ $I_R$. This principle is what produces the inverse function of the detector. One should note that an emitter follower 63 connects to transistor 65 in a 'tail chaser' configuration for stability.

Figure 7:
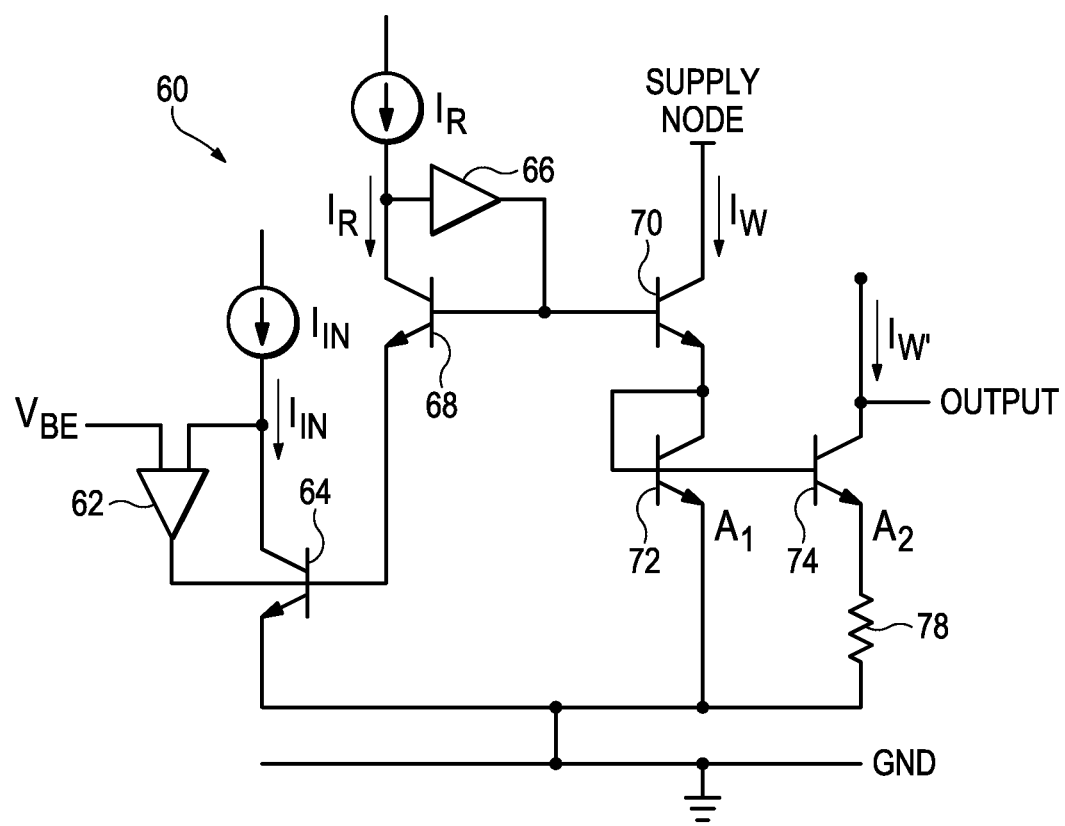
FIG. 7 shows a more detailed embodiment of a nonlinear function circuit.

FIG. 7 shows a more detailed embodiment of a nonlinear function circuit 60. The current upon which the nonlinear function circuit 60 acts is a current proportional to the $V_{IN}$ of FIG. 5. This current is $I_{IN}$ for purposes of this discussion, but was earlier referred to as $I_{OUT}$ in FIG. 5. The reference current $I_R$ scales the whole function. The reference current comes from a reference generator that can be set with the desired scale factor. The amplifier 62 ensures that the voltage of the transistor 64 is sufficient to absorb the current $I_{IN}$, and controls the reference point of the collector of the transistor 64. Similarly, the amplifier 66 controls the reference point of the collector of the transistor 68.

The summing node (NODE) of the output amplifier of FIG. 5 has a voltage that is lower in voltage than the collector of transistor 70 can tolerate. One embodiment to rectify this situation replicates the current in transistor 72 to transistor 74. Transistor 74 has a load resistor that takes the output (OUTPUT) almost to ground, and the NODE is set to a fixed voltage. One should note that the ground lines from resistor 78, the transistor 64, and the transistor 72 are typically tied together. This avoids any variation on the ground lines, in which even a millivolt variation can have negative effects on the operation of the circuit. The resistor 78 causes the output to behave in a 'translinear' way, in which it functions as a square root or other nonlinear function until the output of the linear path dominates the output of the circuit.

A translinear circuit is a circuit that functions under the translinear principle. The translinear principle states that in a closed loop containing an even number of translinear elements with an equal number of them arranged clockwise and counter-clockwise, the product of the currents through the clockwise elements equals the product of the currents through the counter-clockwise elements. In FIG. 7, the translinear loop is formed within the transistors 68, 74, 72, and 65. Under the translinear principle, similar to the discussion of FIG. 6, the product of the currents $I_W I_{W'}$ in the clockwise loop equals the products of $I_{IN} I_R$. The result is that $I_W$ equals the square root of $I_{IN} I_R$. $I_{W'}$ as the output current is then equal to $(A_1/A_2) I_{W'}$.

Figure 8:
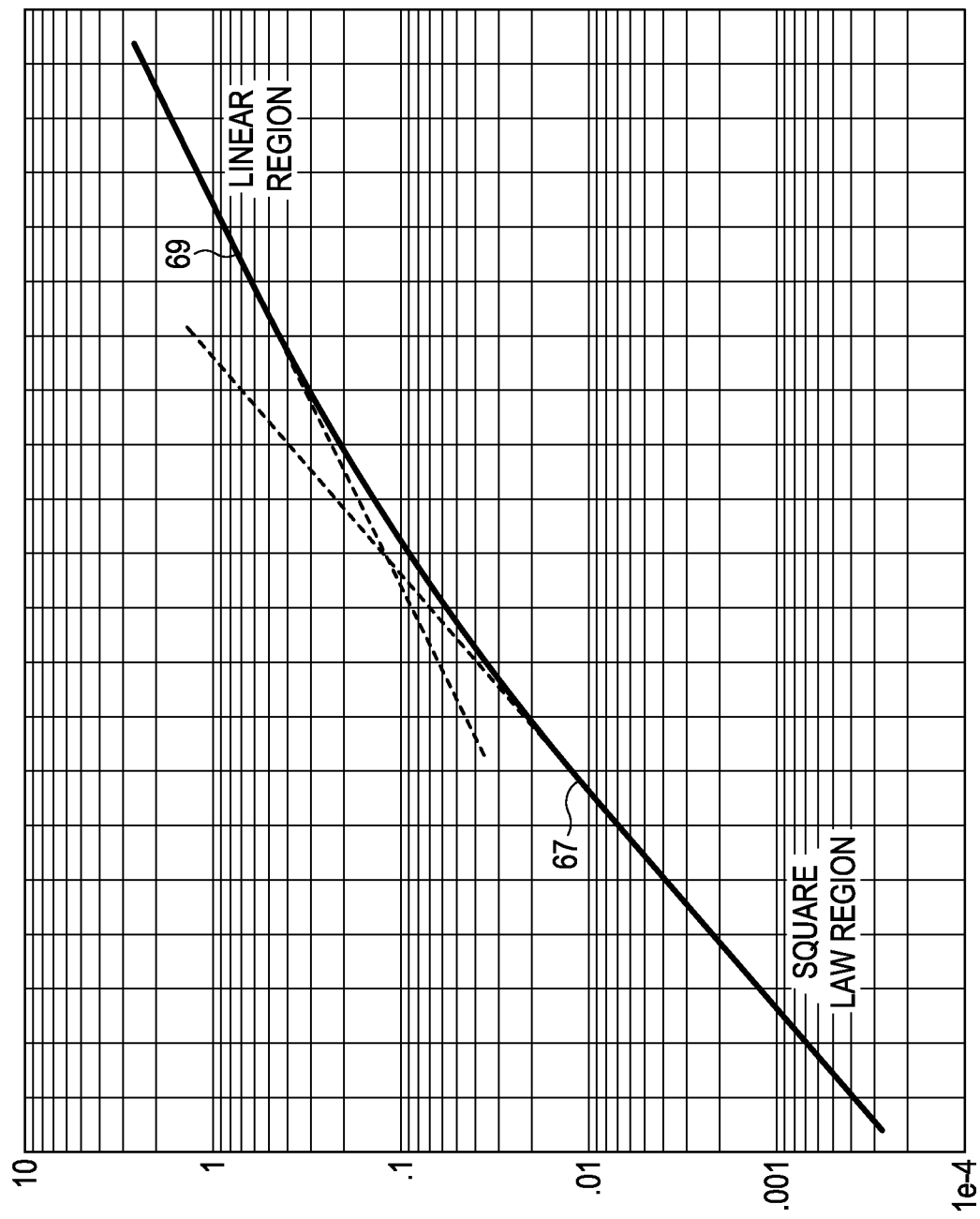
FIG. 8 shows an example of the improved detector's amplitude response.
Figure 9:
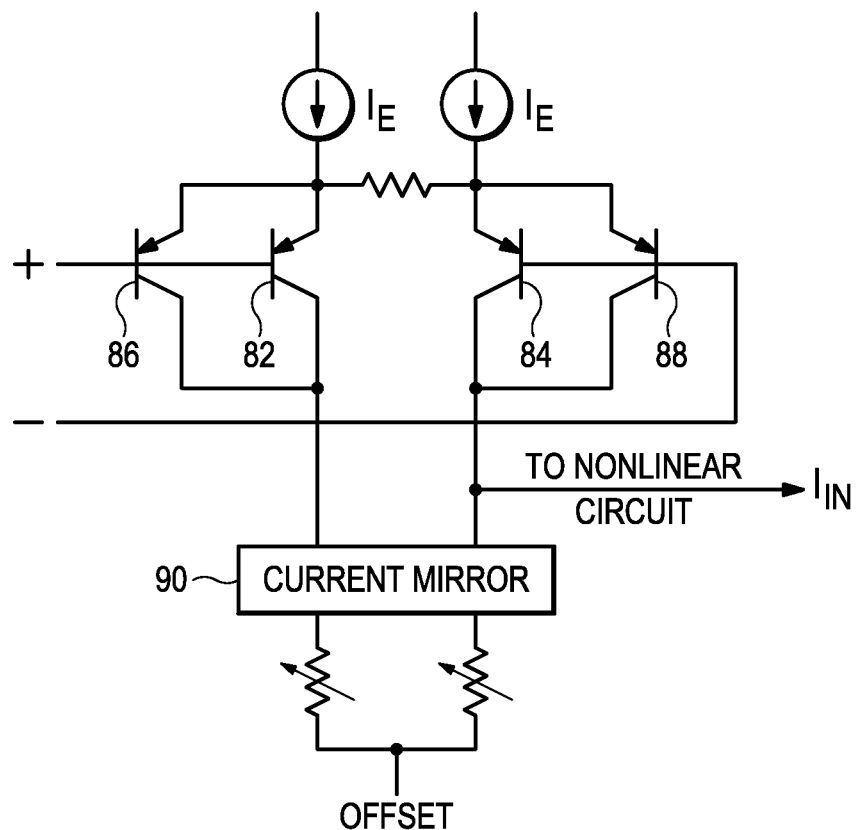
FIG. 9 shows an embodiment of a converter circuit for an output of an RF diode detector.

FIG. 8 shows a curve of a typical detector response. The detector response has a first region 67 often referred to as the 'square law' region, which is exponential in nature. The second region 69 is a linear region. A translinear circuit often operates to linearize the square law region of the response, and then letting the response remain linear in the linear region. The embodiments of the diode RF detector here employ this principle.

As mentioned previously, the nonlinear function circuit 60 operates on the input current $I_{IN}$, which is proportional to the output voltage of the detector. FIG. 8 shows an embodiment of a circuit that takes the output voltage and generates the proportional current. The circuit in this embodiment consists of a degenerated pair of transistors 82 and 84 having bias currents $I_E$. They connect to the differential output voltages from the amplifiers 51 and 53 from FIG. 5. The voltage swing could have a wide dynamic range from 3.2 V (+15 dBm) to the millivolt range. The pair is connected to a current mirror 90 with some adjustments for offsets at OFFSET, allowing an adjustment at the bottom end of the range to ensure proper function of the circuit at the bottom of the range.

One should note that the pair of transistors 82 and 84 will more than likely not match perfectly, so they may be connected in a 'cross-quad' manner using transistors 86 and 88 to ensure stability of the transistors. Similarly, other transistors in the other figures and embodiments may also have cross-quad transistors, but these embodiments were not shown for simplicity. However, no limitation to using or not using cross-quad transistors is intended nor should any be implied.

In this manner, an RF power detector using diode detectors is created. It has high dynamic range, even at very high bandwidths in the hundreds of Gigahertz range, good temperature behavior, and high sensitivity. Different embodiments and implementations of specific components of the embodiments are shown here and any and all variations of these components and their configurations may be used in any and all of the different embodiments.

The embodiments described herein can be modified in arrangement and detail without departing from the inventive concepts. For example, some of the principles have been described above in the context of a radio frequency power detector using diodes. Nonetheless, the principles also have utility separately, and in other applications. Many numerical examples have been provided to facilitate explanation of the inventive principles, but the inventive principles are not limited to any such specific examples. Accordingly, such changes and modifications are considered to fall within the scope of the following claims.

The invention claimed is:

1. A radio frequency (RF) detector, comprising:
   a set of diodes having a differential voltage output and an input to receive an RF input signal, wherein the set of diodes comprises a pair of diodes on each of two branches, and the branches are electrically coupled to a common input node; and
   first and second current sources electrically coupled to the set of diodes, wherein the first current source is to inject current at a node between the pair of diodes on the first branch, the second current source is to sink current at a node between the pair of diodes on the second branch, and diodes in the set of diodes are held in conduction even in an absence of the RF input signal.

2. The RF detector of claim 1, comprising a capacitor electrically coupled to the first current source and a capacitor electrically coupled to the second current source.

3. The RF detector of claim 1, wherein the set of diodes comprises a duplicate diode for each diode in the set, and wherein the duplicate diode is arranged in parallel with its corresponding diode.

4. The RF detector of claim 1, further comprising a converter circuit connected to the differential voltage output, the converter circuit to convert the differential voltage output to a current.

5. The RF detector of claim 1, the RF detector being packaged into a microwave package.

6. The RF detector of claim 1, further comprising third and fourth current sources to maintain an equal forward bias current through each diode in the pair of diodes of the first branch and each diode in the pair of diodes of the second branch.

7. The RF detector of claim 1, wherein an incoming RF signal is coupled to the common input node via a resistor.

8. A radio frequency (RF) power detection system, comprising:
   an RF detector comprising a set of diodes having a differential voltage output, wherein the set of diodes is electrically coupled to an incoming RF signal, the detector includes one or more current sources connected to the set of diodes such that the set of diodes are held forward-biased even in an absence of an incoming RF signal, the set of diodes includes a pair of diodes on each of two branches, and individual diodes in each pair are arranged with opposite polarity along the corresponding branch; and a nonlinear function circuit to produce an output signal based on the differential voltage output.

9. The RF power detection system of claim 8, further comprising an RMS (root-mean-square) module electrically coupled to an output of the nonlinear function circuit, the RMS module to produce an RMS output signal.

10. The RF power detection system of claim 9, further comprising a logarithmic amplifier coupled to the RMS module to receive the RMS output signal.

11. The RF power detection system of claim 8, wherein the set of diodes comprises a ring of diodes.

12. The RF power detection system of claim 8, further comprising a converter circuit electrically coupled between an output of the RF detector and an input of the nonlinear function circuit, wherein the converter circuit is to convert the differential voltage output to a current signal and the nonlinear function circuit is to receive the current signal as its input.

13. The RF power detection system of claim 8, wherein the current source comprises first and second current sources, the first current source forward-biases the pair of diodes on a first branch of the two branches, and the second current source forward-biases the pair of diodes on a second branch of the two branches.

14. The RF power detection system of claim 13, wherein the first current source is to inject current at a node between the pair of diodes on the first branch, and the second current source is to sink current at a node between the pair of diodes on the second branch.

15. The RF power detection system of claim 13, wherein a current sink is coupled to an end of the first branch and a current source is coupled to an end of the second branch.

16. The RF power detection system of claim 8, wherein the differential voltage output has a positive terminal and a negative terminal, the negative terminal is located on a first branch of the two branches, and the positive terminal is located on a second branch of the two branches.

17. The RF power detection system of claim 8, wherein the nonlinear function circuit is a square rooting circuit.

18. The RF power detection system of claim 17, further comprising an amplifier to receive an output of the square rooting circuit and an signal representative of an output of the RF detector, wherein the amplifier is to generate an output whose dependence on the output of the square rooting circuit decreases as a power of the incoming RF signal increases.

19. A method of detecting a radio frequency (RF) signal, comprising:
   receiving an incoming RF signal at a diode-based circuit, wherein the diode-based circuit includes two branches of diodes that are held in conduction, even in an absence of the incoming RF signal, by one or more constant current sources, and wherein each branch includes a pair of diodes arranged with opposite polarity along the corresponding branch;
   generating a differential output voltage representative of the incoming RF signal, wherein the differential output voltage is measured between ends of the two branches; and
   generating, by a nonlinear function circuit, an output signal based on the differential output voltage.

20. The method of claim 19, wherein each of the two branches is coupled to a pair of current sources having opposite polarities.

21. The method of claim 19, further comprising:
   generating a signal representative of a square root of the differential output voltage; and
   determining a power of the incoming RF signal based on the signal.

\* \* \* \* \*